(12) United States Patent
Tsuji (10) Patent No.: US 10,392,576 B2
(45) Date of Patent: Aug. 27, 2019

(54) COATED SLIDING MEMBER

(71) Applicant: KABUSHIKI KAISHA RIKEN, Tokyo (JP)

(72) Inventor: Katsuhiro Tsuji, Niigata (JP)

(73) Assignee: KABUSHIKI KAISHA RIKEN, Tokyo (JP)

( * ) Notice: Subject to any disclaimer, the term of this patent is extended or adjusted under 35 U.S.C. 154(b) by 182 days.

(21) Appl. No.: 15/511,694

(22) PCT Filed: Aug. 10, 2015

(86) PCT No.: PCT/JP2015/072647
§ 371 (c)(1),
(2) Date: Mar. 16, 2017

(87) PCT Pub. No.: WO2016/042945
PCT Pub. Date: Mar. 24, 2016

(65) Prior Publication Data
US 2017/0253825 A1    Sep. 7, 2017

(30) Foreign Application Priority Data
Sep. 16, 2014 (JP) ................................ 2014-187450

(51) Int. Cl.
*C23C 14/06* (2006.01)
*C10M 103/02* (2006.01)
(Continued)

(52) U.S. Cl.
CPC ........... *C10M 103/02* (2013.01); *C01B 32/05* (2017.08); *C01B 32/25* (2017.08); *C01B 32/26* (2017.08);
(Continued)

(58) Field of Classification Search
USPC ................................ 428/408, 216, 336, 704
See application file for complete search history.

(56) References Cited

U.S. PATENT DOCUMENTS 5,474,816 A * 12/1995 Falabella ............ C23C 14/0605
423/446
5,989,511 A * 11/1999 Gruen ................. C23C 14/0605
423/446
(Continued)

FOREIGN PATENT DOCUMENTS

DE     100 17 459      10/2000
EP     2 316 983        5/2011
(Continued)

OTHER PUBLICATIONS

Pei et al Surface modification of NiTi alloys using nitrogen doped diamond-like carbon coatings fabricated by plasma immersion ion implantation and deposition: Journal of Alloys & Compounds 581 (2013) p. 873-876 (Year: 2013).*
(Continued)

*Primary Examiner* — Archene A Turner
(74) *Attorney, Agent, or Firm* — Hunton Andrews Kurth LLP (57) ABSTRACT

A coated sliding member 10 for use under an environment where it is in contact with lubricant, comprising: a base material 12; and a first hard carbon layer 14 having a thickness of 3 μm or more formed on a surface of the base material by a vacuum arc method using carbon and consisting of diamond-like carbon, containing substantially no hydrogen and being configured only of carbon, and a second hard carbon layer 15 formed on a surface of the first hard carbon layer by a vacuum arc method using carbon and consisting of diamond-like carbon, containing substantially no hydrogen and being configured only of carbon and nitrogen, the film thickness of the second hard carbon layer being 3 to 35% of the film thickness of the first hard carbon layer.

6 Claims, 4 Drawing Sheets

(51) Int. Cl.

| | | |
|---|---|---|
| *F16J 9/26* | (2006.01) | |
| *C10M 105/56* | (2006.01) | |
| *C23C 14/24* | (2006.01) | |
| *C01B 32/05* | (2017.01) | |
| *C01B 32/26* | (2017.01) | |
| *C01B 32/25* | (2017.01) | |

(52) U.S. Cl.
CPC .......... *C10M 105/56* (2013.01); *C23C 14/06* (2013.01); *C23C 14/0605* (2013.01); *C23C 14/24* (2013.01); *F16J 9/26* (2013.01); *C01P 2002/82* (2013.01); *C01P 2006/80* (2013.01); *C10M 2201/041* (2013.01); *C10M 2215/00* (2013.01)

(56) References Cited

U.S. PATENT DOCUMENTS

| | | | | |
|---|---|---|---|---|
| 6,354,008 | B1* | 3/2002 | Domoto | B26B 19/38 30/346.53 |
| 6,881,475 | B2* | 4/2005 | Ohtani | C23C 14/022 428/216 |
| 7,273,655 | B2* | 9/2007 | Miyake | F01L 1/143 428/408 |
| 7,537,835 | B2* | 5/2009 | Mori | F16C 33/12 428/704 |
| 2011/0143976 | A1 | 6/2011 | Ito | C23C 14/0036 508/109 |
| 2013/0140776 | A1* | 6/2013 | Kennedy | C23C 14/025 277/442 |
| 2013/0316156 | A1* | 11/2013 | Kennedy | C23C 14/0605 428/336 |
| 2015/0292622 | A1* | 10/2015 | Kennedy | C23C 14/0605 277/442 |

FOREIGN PATENT DOCUMENTS

| | | |
|---|---|---|
| JP | 2000-128516 | 5/2000 |
| JP | 2000-246371 | 9/2000 |
| JP | 2001-064005 | 3/2001 |
| JP | 2003-282237 | 10/2003 |
| JP | 2008229780 | * 10/2008 |
| JP | 2008297477 | * 12/2008 |
| WO | 2007/072658 A1 | 6/2007 |
| WO | 2012/072483 | 6/2012 |
| WO | 2013/137060 | 9/2013 |
| WO | WO2014068040 | * 5/2014 |

OTHER PUBLICATIONS

Kahn et al "Properties of DLC and Nitrogen-Doped DLC Films Deposited by DC Magnetron Sputtering" Plasma Process Polym. (2007) 4 p. S200-S204. (Year: 2007).*

Yan e al "Study of structure, tribological properties and growth mechanism of DLC and nitrogen-doped DLC film deposited by electrochemical technique" Applied Surface Science 236 (2004) p. 328-355. (Year: 2004).*

Kwok et al "Hemocompatibilty of nitrogen-doped, hydrogen-free diamond-like carbon prepared by nitrogen immersion ion implantation-deposition" Wiley Interscience (2004) (Year: 2004).*

International Search Report dated Oct. 27, 2015 in PCT/JP2015/072647.

Supplementary European Search Report dated Feb. 1, 2018 in PCT/JP2015/072647.

* cited by examiner

COATED SLIDING MEMBER

CROSS-REFERENCE TO RELATED APPLICATIONS

This application is the U.S. National Phase of International Patent Application No. PCT/JP2015/072647, filed Aug. 10, 2015, the contents of which claims the benefit of priority to Japanese Patent Application No. JP 2014-187450, filed Sep. 16, 2014, the contents of each are hereby incorporated by reference in their entireties.

FIELD OF THE INVENTION

The present invention relates to a coated sliding member such as machine parts used under an environment where it is in contact with lubricant, the coated sliding member having a hard carbon film formed on a surface of a base material.

DESCRIPTION OF THE RELATED ART

In recent years, a high output, a long life, and an improved fuel efficiency are needed by an internal combustion engine, mainly by an automotive engine. Especially, in order to improve the fuel efficiency, it is needed that a friction loss between a piston ring as a sliding member and a cylinder is reduced, a high-pressure gas upon combustion is effectively sealed, and expansion energy of combustion gas is efficiently converted into kinetic energy. Accordingly, a hard carbon film having a low friction coefficient is formed on a surface of a periphery of the piston ring.

In particular, a hard carbon film substantially constituted only of carbon has an sp3 structure having a bonding state that is the same as diamond in a higher ratio than an sp2 structure having a bonding state that is the same as graphite, and has high hardness and high abrasion resistance.

In view of above, there is disclosed a technology that a lower layer including a first diamond-like carbon (DLC) thin film containing no hydrogen is formed on a surface of a base material by a vacuum arc method (a cathode arc ion plating method) using carbon, and an upper layer including a second diamond-like carbon thin film containing hydrogen is formed on a surface of the lower layer by the plasma CVD method (Patent Literature 1). By the technology, the DLC thin film having high hardness containing hydrogen is disposed on an outermost surface as the upper layer to ensure a low friction coefficient, and the DLC thin film itself is disposed as the lower layer in order to improve adhesion between the upper layer and the base material, whereby both of low abrasion and adhesion can be provided.

In addition, when the DLC thin film is smooth, it shows extremely a low friction coefficient. When surface roughness of the film is increased, a friction coefficient and attackability to the opposite material are increased. Then, there is reported a technology that a DLC thin film is formed on a surface of a base material as a lower layer by the cathode arc ion plating method, and a DLC thin film having a small friction coefficient, low attackability to the opposite material having low hardness, is laminated on the surface of the lower layer (Patent Literature 2). By the technology, even if the surface of the DLC thin film as the lower layer is rough, there can be provided sliding properties such as a small friction coefficient and low attackability to the opposite material.

Meanwhile, it is known that friction properties of the DLC thin film are not sufficiently shown in the lubricant, and the DLC thin film shows the friction properties as low as those of other film. Then, there is reported a technology that a diamond polycrystalline film is precipitated as a hard carbon film on a surface of a base material by a thermal CVD method, a film surface is polished and finished to be smooth, and thereafter the film surface is subjected to nitrogen plasma processing (Patent Literature 3). By the technology, by setting a hydrogen content in the hard carbon film to 10 at % or less, and by providing the surface of the film with many polar groups, an oily additive contained in the lubricant is easily adsorbed physically or chemically, and low friction is realized in the lubricant.

PRIOR ART LITERATURE

Patent Literature

[Patent Literature 1] Japanese Unexamined Patent Publication (Kokai) 2000-128516
[Patent Literature 2] Japanese Unexamined Patent Publication (Kokai) 2001-64005
[Patent Literature 3] Japanese Unexamined Patent Publication (Kokai) 2000-297373 (Example 6)

SUMMARY OF THE INVENTION

Problems to be Solved by the Invention

Incidentally, when a diamond-like carbon (DLC) thin film is formed by a vacuum arc method (cathode arc ion plating method), carbon particles are discharged from the carbon cathode by the arc discharge, and are taken into the film. On the fine carbon particles taken in, the film is further formed, thereby undesirably increasing the surface roughness of the film. In particular, when the thickness of the DLC thin film is 3 µm or more, the surface roughness is significantly great, and a friction coefficient and attackability to the opposite material are increased. Therefore, it is needed to polish a surface of a film to be smooth. However, when the DLC thin film has high hardness, polishing becomes difficult.

The technologies described in Patent Literatures 1, 2 study only the lower layer including the DLC thin film having a thickness of about 1 µm, and do not disclose a measure to make polishing easier when the surface roughness is increased by increasing the thickness of the film to 3 µm or more. Furthermore, Patent Literatures 1 and 2 do not disclose a measure to realize low friction in the lubricant.

Meanwhile, in the technology described in Patent Literature 3, after the diamond polycrystalline film is precipitated by the thermal CVD method, the film surface is polished to be smooth. As the diamond polycrystalline film including diamond crystal has a rough and hard surface as compared to the DLC thin film that is an amorphous film, polishing the surface of the film is extremely difficult as compared with the DLC thin film, and productivity is undesirably significantly lowered. In addition, Patent Literature 3 describes that the diamond polycrystalline film is subjected to nitrogen plasma processing later to take in nitrogen to the film. However, even if the DLC film is subjected to nitrogen plasma processing later, nitrogen is difficult to be taken in.

Although Patent Literature 3 describes in Example 4 that the DLC thin film is formed by the plasma CVD method, the DLC thin film has a thickness of less than 3 µm, which does not disclose the technology that makes the polishing easier.

The present invention is to solve the above-describe problems, and has an object to provide a coated sliding member by easily polishing a surface of a film where diamond-like carbon containing no hydrogen having a thickness of 3 μm or more is formed on a surface of a base material, and by realizing low friction and abrasion resistance under an environment where it is in contact with lubricant.

Means for Solving the Problems

In order to solve the above-described problems, the present invention provides a coated sliding member for use under an environment where it is in contact with lubricant, comprising: a base material; and a hard carbon film formed on a surface of the base material, the hard carbon film being constituted of a first hard carbon layer having a thickness of 3 μm or more formed on a surface of the base material by a vacuum arc method using carbon and consisting of diamond-like carbon, containing substantially no hydrogen and being constituted only of carbon, and a second hard carbon layer formed on a surface of the first hard carbon layer by a vacuum arc method using carbon and consisting of diamond-like carbon, containing substantially no hydrogen and being constituted only of carbon and nitrogen, the film thickness of the second hard carbon layer being 3 to 35% of the film thickness of the first hard carbon layer.

According to the coated sliding member, the first hard carbon layer substantially contains no hydrogen, is constituted only of hydrogen, has high hardness, and a thickness of 3 μm or more, thereby ensuring abrasion resistance under an environment where it is in contact with lubricant for a prolonged period. When the diamond-like carbon (DLC) film contains no hydrogen, adsorption of lubricant components to the film is less likely to be inhibited, and a tribo-film that decreases a friction coefficient of a sliding surface is formed.

Incidentally, it is difficult to polish smoothly the surface of the first hard carbon layer having high hardness after film formation. By providing the surface of the first hard carbon layer with the second hard carbon layer that is softer than the first hard carbon layer and is easily polished, the first hard carbon layer sufficiently becomes smooth by polishing only a part (convex part) of the first hard carbon layer is polished. Thus, low friction can be realized, while the polishing difficulty is reduced, and the productivity is increased. In addition, when the second hard carbon layer as the DLC film contains nitrogen, nitrogen atoms that form polar groups are present on the surface of the film, whereby an oiliness additive included in the lubricant is likely to be adsorbed physically or chemically on the surface so that low friction can be realized in the lubricant. Furthermore, the abrasion resistance is decreased as compared to the DLC film (first hard carbon layer) containing no nitrogen, and the surface is easily polished. In summary, the nitrogen in the second hard carbon layer has two actions that the low friction is realized under the environment where it is in contact with lubricant, and the film is soften for easy polishing.

When the arithmetic mean roughness Ra according to JIS-B0601 of the surface of the second hard carbon layer is 0.2 μm or less, a friction coefficient is preferably decreased and attackability to the opposite material is also preferably decreased. Here, the Ra of the surface of the second hard carbon layer is a value after the surface of the second hard carbon layer is polished.

When the percentage of the nitrogen represented by atom % of the second hard carbon layer is 3 to 15% with respect to a total content of carbon and nitrogen, polishing is easily performed, the low friction is realized under the environment where it is in contact with lubricant, a decrease in the abrasion resistance due to the second hard carbon layer excessively softened can be inhibited.

Preferably, in the Raman spectroscopy of the surface of the first hard carbon layer, when the first hard carbon layer has a peak within a region of wavenumbers 900 to 1900 $cm^{-1}$, and the peak waveform is separated into a first Gaussian function Id having a maximum value within a region of wavenumbers 1200 $cm^{-1}$ to 1400 $cm^{-1}$ and a second Gaussian function Ig having a maximum value within a region of wavenumbers 1450 $cm^{-1}$ to 1650 $cm^{-1}$, a ratio Icd/Icg where the Icd is the maximum value of the first Gaussian function Id, and the Icg is the maximum value of the second Gaussian function Ig is 0.8 to 1.8.

When Icd/Icg is 0.8 to 1.8, a ratio of an sp3 bond and an sp2 bond in the first hard carbon layer becomes adequate, and the hard carbon layer can have small internal stress, while maintaining the abrasion resistance.

Preferably, in the Raman spectroscopy of the surface of the first hard carbon layer, when the first hard carbon layer has a peak within a region of wavenumbers 900 to 1900 $cm^{-1}$, and the peak waveform is separated into a first Gaussian function Id having a maximum value within a region of wavenumbers 1200 $cm^{-1}$ to 1400 $cm^{-1}$ and a second Gaussian function Ig having a maximum value within a region of wavenumbers 1450 $cm^{-1}$ to 1650 $cm^{-1}$, a ratio Ecd/Ecg where the Ecd is integrated intensity of the first Gaussian function Id, and the Ecg is integrated intensity of the second Gaussian function Ig is 1.7 to 3.8.

When Ecd/Ecg is 1.7 to 3.8, a ratio of an sp3 bond and an sp2 bond in the first hard carbon layer becomes adequate, and the hard carbon layer can have small internal stress, while maintaining the abrasion resistance.

Preferably, in the Raman spectroscopy of the surface of the second hard carbon layer, when the second hard carbon layer has a peak within a region of wavenumbers 900 to 1900 $cm^{-1}$, and the peak waveform is separated into a first Gaussian function Id having a maximum value within a region of wavenumbers 1200 $cm^{-1}$ to 1400 $cm^{-1}$ and a second Gaussian function Ig having a maximum value within a region of wavenumbers 1450 $cm^{-1}$ to 1650 $cm^{-1}$, a ratio Icd/Icg where the Icd is the maximum value of the first Gaussian function Id, and the Icg is the maximum value of the second Gaussian function Ig is 1.5 to 2.5.

When Icd/Icg is 1.5 to 2.5, a ratio of an sp3 bond and an sp2 bond in the second hard carbon layer becomes adequate, and the hard carbon layer can have small internal stress, while maintaining the abrasion resistance.

Preferably, in the Raman spectroscopy of the surface of the second hard carbon layer, when the second hard carbon layer has a peak within a region of wavenumbers 900 to 1900 $cm^{-1}$, and the peak waveform is separated into a first Gaussian function Id having a maximum value within a region of wavenumbers 1200 $cm^{-1}$ to 1400 $cm^{-1}$ and a second Gaussian function Ig having a maximum value within a region of wavenumbers 1450 $cm^{-1}$ to 1650 $cm^{-1}$, a ratio Ecd/Ecg where the Ecd is integrated intensity of the first Gaussian function Id, and the Ecg is integrated intensity of the second Gaussian function Ig is 4.0 to 6.0.

When Ecd/Ecg is 4.0 to 6.0, a ratio of an sp3 bond and an sp2 bond in the second hard carbon layer becomes adequate, and the hard carbon layer can have small internal stress, while maintaining the abrasion resistance.

Effects of the Invention

According to the present invention, a surface of a film can be easily polished when diamond-like carbon containing no hydrogen having a thickness of 3 μm or more is formed on a surface of a base material, and low friction and abrasion resistance can be realized under an environment where it is in contact with lubricant.

DESCRIPTION OF THE EMBODIMENTS

Hereinafter, embodiments of the present invention will be described.

A coated sliding member according to the embodiments of the present invention is used under environment where it is in contact with lubricant.

Figure 1:
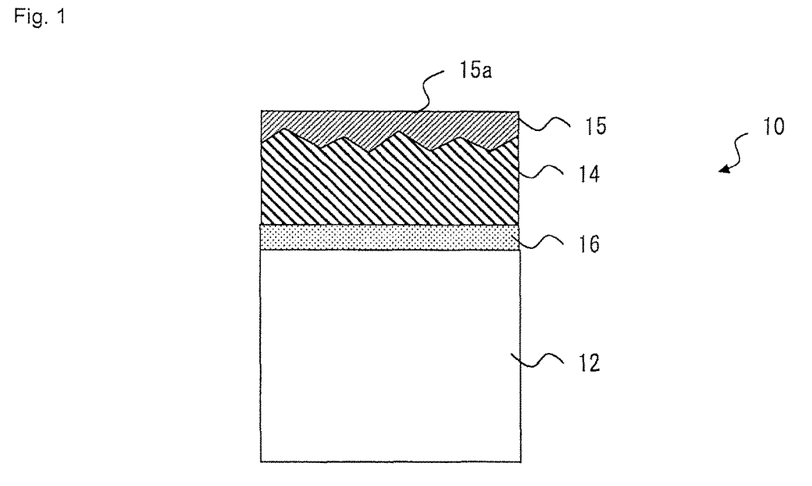
[FIG. 1] A cross-sectional view of a coated sliding member according to an embodiment of the present invention.

FIG. 1 shows a cross-sectional view of a coated sliding member 10 according to an embodiment of the present invention. The coated sliding member 10 includes a base material 12, an intermediate layer 16, a first hard carbon layer 14 having a thickness of 3 μm or more, and a second hard carbon layer 15 laminated in this order.

The base material 12 includes iron, cast iron, cemented carbide, stainless steel and the like. In particular, when a piston ring is used as the base material 12, stainless steel is preferable. In addition, a metal nitride based hard coating such as chromium nitride, or nitriding processing may be applied to a surface of the base material 12. The surface roughness of the base material is not especially limited, but the arithmetic mean roughness Ra according to JIS-B0601 is preferably 0.1 μm or less.

Although the intermediate layer 16 is not an essential component in the present invention, when the intermediate layer 16 is disposed, adhesion between the base material 12 and the first hard carbon layer 14 is improved. A preferable composition of the intermediate layer 16 includes one or more selected from chromium, titanium, tungsten carbide and silicon carbide.

The first hard carbon layer 14 is formed by a vacuum arc method using carbon, and consists of diamond-like carbon substantially containing no hydrogen and containing only carbon.

The diamond-like carbon (DLC) film substantially containing no hydrogen and containing only carbon has an sp3 structure having a bonding state that is the same as diamond in a higher ratio than an sp2 structure having a bonding state that is the same as graphite, and has high hardness and high abrasion resistance. By using carbon as a cathode and evaporating carbon from the carbon cathode by arc discharge using the vacuum arc method (cathode arc ion plating method), hydrogen from a raw material is not taken into the film, and the DLC film substantially containing no hydrogen is acquired.

Here, "substantially containing no hydrogen and containing only carbon" means that when a total amount of all elements configuring the first hard carbon layer 14 is defined as 100 atom %, a hydrogen content is 2 atom % or less, and a carbon content is 96 atom % or more. When 96 atom % or more of carbon is contained, less than 4 atom % of elements other than carbon will be contained as impurities, which come from leakage, discharge of moisture adhered to an inner wall of a coating chamber, etc., in all components constituting the first hard carbon layer 14.

The hydrogen and carbon contents of the first hard carbon layer 14 of the hard carbon film formed on a flat surface are evaluated by RBS (Rutherford Back scattering Spectrometry)/HFS (Hydrogen Forward Scattering Spectrometry), and the hydrogen and carbon contents of the first hard carbon layer 14 of the hard carbon film formed on a non-flat surface such as a peripheral surface of the piston ring are evaluated by combining RBS/HFS and SIMS (Second arylon Mass Spectrometry). The RBS/HFS is a known analysis method for a film composition, but is not applied to a non-flat surface. The RBS/HFS and the SIMS are combined as described later.

Firstly, as a standard sample each having a flat surface, a hard carbon layer to be measured is formed on a mirror polished flat test piece (quenched SKH51 material disc, φ25×thickness 5 (mm), hardness of HRC 60 to 63). The standard sample is produced separately corresponding to the first hard carbon layer and the second hard carbon layer, respectively. The standard sample on which only the first hard carbon layer is formed is referred to as "a first standard sample", and the standard sample on which only the second hard carbon layer is formed is referred to as "a second standard sample".

The film formation of the first standard sample is done using a reactive sputtering method and introducing $C_2H_2$, Ar, $H_2$ as atmospheric gas. The hydrogen content included in the film of the first standard sample is adjusted by changing an $H_2$ flow rate and/or a $C_2H_2$ flow rate. In this manner, each hard carbon film constituted only of hydrogen and carbon and different hydrogen contents is formed. The composition (all elements including hydrogen) of each hard carbon film of the first standard sample is measured by the RBS/HFS.

Next, each film of the first standard sample is analyzed by the SIMS, and a secondary ion intensity of hydrogen and carbon is measured. Here, by the SIMS analysis, the film formed on the non-flat surface such as the peripheral surface of the piston ring can be measured. Accordingly, by determining an empirical formula (measurement line) showing a relationship between the hydrogen and carbon amounts (unit: atom %) acquired by the RBS/HFS, and the ratio of the secondary ion intensities of hydrogen and carbon acquired by the SIMS for the same film of the first standard sample, the hydrogen amount and the carbon amount can be calculated from the hydrogen and carbon secondary ion intensity by the SIMS measured on the actual peripheral surface of the piston ring. It should be noted that the secondary ion intensity value acquired by the SIMS is an average secondary ion intensity value of each element observed at the depth of at least 20 nm or more from the surface of the film within 50 nm square.

The film formation of the second standard sample is done by using a reactive sputtering method, and introducing $O_2H_2$, $N_2$, Ar, $H_2$ as atmospheric gas. The hydrogen content included in the film of the second standard sample is adjusted by changing an $H_2$ flow rate or a $C_2H_2$ flow rate. The nitrogen content included in the film of the second standard sample is adjusted by changing an $N_2$ flow rate. In this manner, each hard carbon film constituted of hydrogen, carbon and nitrogen having different hydrogen and nitrogen contents is formed. The composition (all elements including hydrogen) of the hard carbon film of the second standard sample is measured by the RBS/HFS.

Next, each film of the second standard sample is analyzed by the SIMS, the secondary ion intensity of hydrogen, carbon and nitrogen is measured. Accordingly, by determining an empirical formula (measurement line) showing a relationship between the hydrogen, carbon and nitrogen amounts (unit: atom %) acquired by the RBS/HFS, and the ratio of the intensities of hydrogen and nitrogen based on carbon secondary ion intensity of secondary ion intensity of hydrogen, carbon and nitrogen acquired by the SIMS for the same film of the second standard sample, the hydrogen amount, the carbon amount, and the nitrogen amount can be calculated from the hydrogen, carbon and nitrogen secondary ion intensity by the SIMS measured on the actual non-flat test piece. The secondary ion intensity value by the SIMS is an average value of the secondary ion intensity of each element observed at the thickness of at least 20 nm or more from the surface of the film within 50 nm square.

When the thickness of the first hard carbon layer 14 is 3 μm or more, abrasion resistance can be ensured under an environment where it is in contact with lubricant for a prolonged period. If the first hard carbon layer 14 is less than 3 μm, the first hard carbon layer 14 used under an environment where it is in contact with lubricant for a prolonged period is abraded, and the abrasion resistance is lowered. The thickness of the first hard carbon layer 14 is preferably 5 μm or more. An upper limit of the thickness of the first hard carbon layer 14 is, for example, 25 μm.

Figure 2:
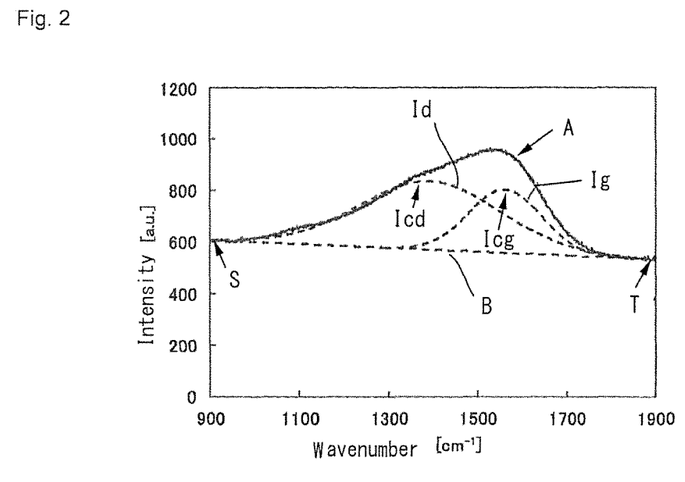
[FIG. 2] A graph showing Raman spectroscopy spectrum and peak waveform separation of a surface of a first hard carbon layer in Example 1.

FIG. 2 shows a Raman spectroscopy spectrum and peak waveform separation of a surface of the first hard carbon layer 14 in Example 1 described later. In the Raman spectroscopy of the surface of the first hard carbon layer 14, when the first hard carbon layer 14 has a peak within a region of wavenumbers 900 to 1900 $cm^{-1}$, and the peak waveform is separated into a first Gaussian function Id having a maximum value within a region of wavenumbers 1200 $cm^{-1}$ to 1400 $cm^{-1}$ and a second Gaussian function Ig having a maximum value within a region of wavenumbers 1450 $cm^{-1}$ to 1650 $cm^{-1}$, a ratio Icd/Icg where the Icd is the maximum value of the first Gaussian function Id, and the Icg is the maximum value of the second Gaussian function Ig is preferably 0.8 to 1.8. Also, a ratio Ecd/Ecg where the Ecd is integrated intensity of the first Gaussian function Id, and the Ecg is integrated intensity of the second Gaussian function Ig is preferably 1.7 to 3.8.

In general, it is said that the first Gaussian function Id having a peak around a wavenumber 1350 $cm^{-1}$ is relevant to an sp2 bond between carbons, and the second Gaussian function Ig having a peak around a wavenumber 1550 $cm^{-1}$ is relevant to an sp3 bond between carbons. Therefore, Icd/Icg and Ecd/Ecg is an index of a carbon bonding state of the first hard carbon layer 14.

When Icd/Icg is less than 0.8, or Ecd/Ecg is less than 1.7, the sp3 bonds within carbon-carbon bonds in the first hard carbon layer 14 occupy a high percentage, resulting in a film having a state nearly to diamond crystal. The diamond-like carbon film is amorphous, and has not high crystallinity as compared to the diamond crystal. Accordingly, if the sp3 bonds nearly to the diamond crystal are too much, a stress is generated within the film. If it is applied to a sliding member having low rigidity being typified by the piston ring, the base material may be deformed.

On the other hand, when Icd/Icg exceeds 1.8, or Ecd/Ecg exceeds 3.8, a percentage of the sp3 bonds within the carbon-carbon bonds in the first hard carbon layer 14 becomes too low, a percentage of the sp2 bods having lower hardness increases, and the abrasion resistance of the film may be lowered.

Accordingly, by defining Icd/Icg or Ecd/Ecg within the above-described range, a ratio of the sp3 bond and the sp2 bond of carbon in the film becomes adequate, and the hard carbon layer can have small internal stress, while maintaining the abrasion resistance.

Next, an illustrative method of forming the first hard carbon layer 14 will be described.

Figure 3:
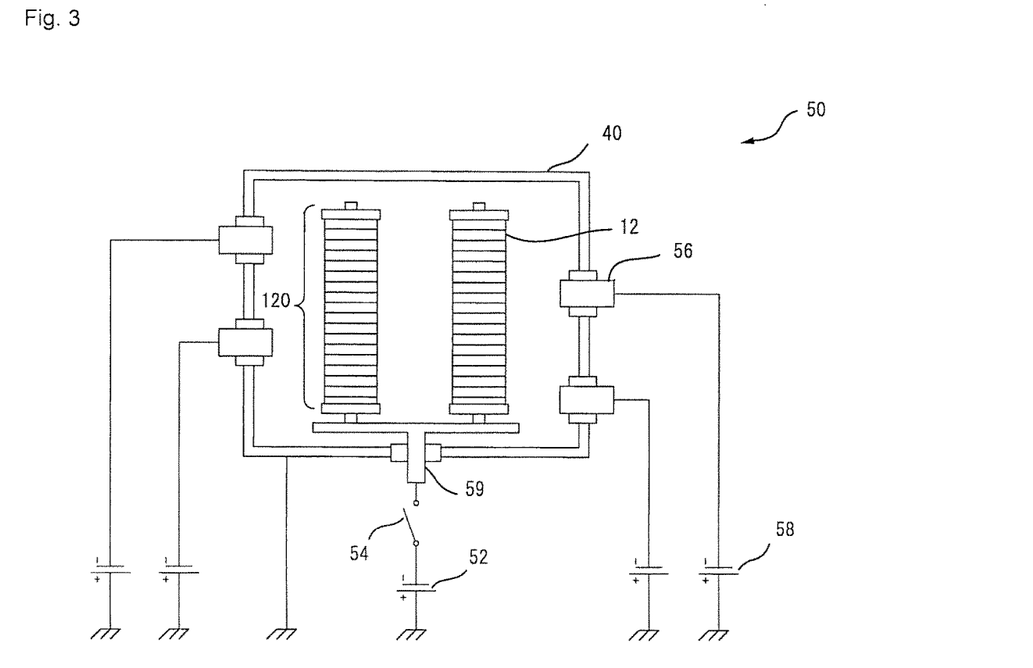
[FIG. 3] A cross-sectional view showing an example of a coating apparatus for forming a first and second hard carbon layers.

FIG. 3 shows an example of a coating apparatus 50 for forming the hard carbon film 3. The coating apparatus 50 is an arc ion plating apparatus having a cathode discharge type arc evaporation source including carbon cathodes. The coating apparatus 50 includes a vacuum chamber 40, carbon cathodes 56 installed on opposing wall surfaces of the vacuum chamber 40, arc discharge power sources 58 connected to the carbon cathodes 56, a plurality of jigs 120 installed within the vacuum chamber 40, a motor 59 that rotates each jig 120 around a shaft center Ax, and a bias power source 52 connected to the jigs 120.

A plurality of base materials 12 of the piston ring are attached to center axes of the respective jigs 120 and laminated with each end gap being in the same direction.

In order to form the first hard carbon layer 14 containing no hydrogen by the arc ion plating method, it is necessary to use the carbon cathodes and the gas in coating atmosphere has a molecular formula including no hydrogen (for example, inert gas such as argon). The coating atmosphere may be high-vacuum atmosphere to which gas is not introduced. Specifically, when the first hard carbon layer 14 is formed, except for moisture adhered to an inner wall of the coating chamber and gas components unavoidably flowed into the coating chamber by leakage, by not introducing hydrogen or a molecular component containing hydrogen as a constituent element from the outside, the first hard carbon layer 14 containing no hydrogen can be formed.

In the film formation under high-vacuum atmosphere introducing no gas, carbon ions in plasma generated by the arc discharge are likely to be strongly bonded due to low energy loss by collision, mechanical strength of the hard carbon film formed is high, but stability of the arc discharge is lowered, which tends to increase the frequency of discharge stopping.

In contrast, in the film formation under atmosphere where inert gas such as Ar is introduced, carbon ions discharged from the cathode along with the arc discharge collide with Ar atoms and ions before the film is formed, the frequency that energy is lost increases, but the arc discharge is likely to be stably maintained as compared to the high-vacuum atmosphere.

In view of the above, it is preferable that no inert gas such as Ar be introduced or the pressure be lowered to $1 \times 10^{-2}$ Pa or less. If the inert gas is introduced over the pressure, the film is soften, and the abrasion resistance may be lowered.

As the carbon cathode, solid carbon (for example, graphite, HOPG, carbon rod) may be used.

When the carbon cathode is evaporated by the arc discharge, carbon is ionized, collides with electrons and gas, generates plasma, becomes an ion current I, and flows toward the base material 12 held by the jigs 120. In this state, while the jigs 120 are rotated against the shaft center Ax, the film is formed.

The film formation temperature is preferably 200° C. or less, more preferably 160° C. or less. If the film formation temperature exceeds 200° C., the film formed may be graphitized, and the strength may be lowered.

Also, fine particles (droplets) of carbon are discharged from the carbon cathodes by the arc discharge, and are taken into the film. The film is further formed on the carbon fine particles taken in, and the surface roughness of the film is increased. In particular, as the first hard carbon layer 14 has a thickness of 3 μm or more, the surface roughness is notably increased, and the friction coefficient and the attackability to the opposite material are increased.

Here, in order to decrease the droplets and to inhibit mixing into the film, it is possible to lower the arc discharge current, or include a magnetotransport filter that can select the droplets or a mechanism for removing the droplets such as screen. However, the film-formation speed is decreased, and the maintenance of the droplets removal mechanism is needed, thereby the productivity is lowered. On the other hand, as the first hard carbon layer 14 is constituted only of carbon and substantially contains no hydrogen and has high hardness, it is difficult to polish the surface smoothly after the first hard carbon layer 14 is formed.

In the present invention, by providing the surface of the first hard carbon layer 14 with the second hard carbon layer 15 that is softer than the first hard carbon layer 14 and is easily polished, the first hard carbon layer 14 sufficiently becomes smooth by polishing only a part (convex part) of the first hard carbon layer 14. Thus, low friction can be realized, while the polishing difficulty is reduced, and the productivity is increased.

In other words, the second hard carbon layer 15 is formed by the vacuum arc method using carbon, and consists of diamond-like carbon substantially containing no hydrogen and containing only carbon and nitrogen.

When the diamond-like carbon (DLC) film contains no hydrogen, adsorption of the lubricant components to the film is less likely to be inhibited, and the tribo-film that decreases the friction coefficient of the sliding surface is formed. Thus, low friction can be realized.

Furthermore, when the second hard carbon layer 15 contains nitrogen, nitrogen atoms that form polar groups are present on the surface of the film, whereby the oiliness additive included in the lubricant is likely to be adsorbed physically or chemically on the surface so that low friction can be realized in the lubricant.

In particular, when the lubricant containing fatty acid ester known as a friction reducer is used, the second hard carbon layer is scraped on a surface of a sliding part, and both of the first hard carbon layer and the second hard carbon layer containing no hydrogen are exposed. As described above, the DLC film containing no hydrogen is less likely to inhibit adsorption of the lubricant components (esters) to the film, and is thus excellent in friction lowering. Examples of the fatty acid esters include glycerin monooleate and glycerin dioleate.

Simultaneously, the present inventors have found that when the second hard carbon layer 15 as the DLC film includes nitrogen, the abrasion resistance is lowered and the surface is easily polished as compared to the DLC film (first hard carbon layer 14). That is to say, it has found that the nitrogen in the second hard carbon layer 15 has two actions that the low friction is realized under the environment where it is in contact with the lubricant, and the film is soften for easy polishing.

Here, "constituted only of carbon and nitrogen containing no hydrogen" means that when a total amount of all elements configuring the second hard carbon layer 15 is defined as 100 atom %, a hydrogen content is 2 atom % or less and a total content of carbon and nitrogen is 96 atom % or more. When 96 atom % or more of carbon and nitrogen is contained, less than 4 atom % of elements other than carbon will be contained as unavoidable impurities, which come from leakage, discharge of moisture adhered to an inner wall of a coating chamber, etc., in all components of the second hard carbon layer 15.

The contents of hydrogen, carbon and nitrogen of the second hard carbon layer 15 are evaluated by the RBS/HFS and the SIMS similar to the first hard carbon layer 14.

It should be noted that the composition of the second hard carbon layer 15 is determined by measuring the outermost surface of the second hard carbon layer 15 after polished as it is. On the other hand, the composition of the first hard carbon layer 14 is determined by removing the second hard carbon layer 15 with spherical polishing using a steel ball to which a polisher (diamond having a particle size of 0.2 to 1.0 μm) is applied in advance, removing the first hard carbon layer 14 to ⅓ to ½ of the film thickness, and measuring the surface of the hard carbon layer 14 exposed.

The film thickness of the second hard carbon layer 15 may be 3 to 35% of the film thickness of the first hard carbon layer 14.

If the film thickness is less than 3%, the abrasion resistance of the second hard carbon layer 15 is too high, the first hard carbon layer 14 is not easily polished smoothly, concave and convex remain, the opposite material is attacked and abraded under the environment where it is in contact with the lubricant.

On the other hand, if the film thickness exceeds 35%, the percentage of the second hard carbon layer 15 having low abrasion resistance as compared to the first hard carbon layer 14 is increased, and the abrasion resistance of the surface of the sliding member is poor.

The film thickness is more preferably 10 to 25%.

As described above, as concave and convex of the first hard carbon layer 14 is filled with the second hard carbon layer 15, the second hard carbon layer 15 is directly formed on the surface of the first hard carbon layer 14. In other words, the second hard carbon layer 15 and the first hard carbon layer 14 are directly contacted.

The arithmetic mean roughness Ra of the surface of the second hard carbon layer 15 according to JIS-B0601 is preferably 0.2 μm or less such that a friction coefficient is decreased and the attackability to the opposite material is also decreased. Here, the Ra of the second hard carbon layer 15 is a value after the surface of the second hard carbon layer 15 is polished.

The percentage of the nitrogen represented by atom % of the second hard carbon layer 15 is preferably 3 to 15% with respect to a total content of carbon and nitrogen. If the above-described percentage of the nitrogen is less than 3%, the easy polishing effect is reduced, and the low friction is less likely to be realized under the environment where it is in contact with lubricant. If the above-described percentage of the nitrogen exceeds 15%, the second hard carbon layer 15 is too soften to decrease the abrasion resistance, which may result in inadequate sliding member. The percentage of the nitrogen is more preferably 5 to 12%.

The Icd/Icg of the second hard carbon layer 15 is preferably 1.5 to 2.5. Also, the Ecd/Ecg of the second hard carbon layer 15 is preferably 4.0 to 6.0. The reason why the values are defined is similar to that described in the case of the first hard carbon layer 14, and the description is thus omitted.

Figure 4:
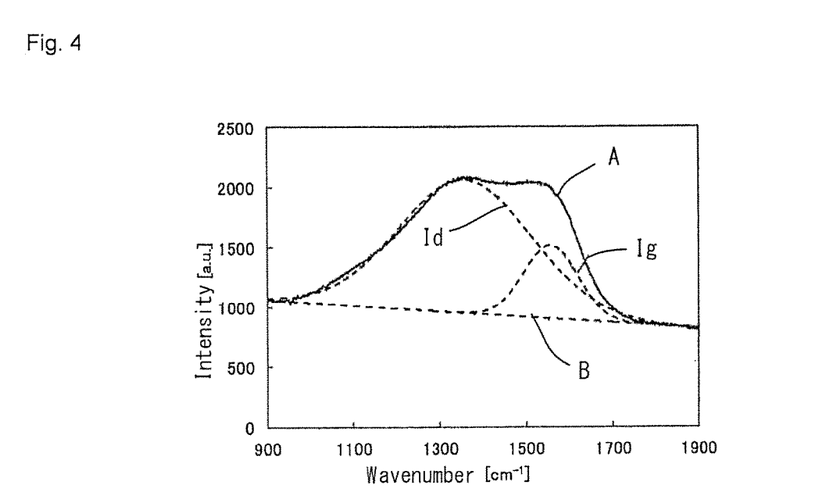
[FIG. 4] A graph showing Raman spectroscopy spectrum and peak waveform separation of a surface of a second hard carbon layer in Example 1.

FIG. 4 shows a Raman spectroscopy spectrum and peak waveform separation of the surface of the second hard carbon layer 15 in Example 1 described later.

The method of forming the second hard carbon layer 15 is almost the same as that of the first hard carbon layer 14, but a film forming raw material including nitrogen is further introduced. Examples of the film forming raw material include nitrogen gas.

EXAMPLES

Example 1

One surface (surface having width of 6.35 mm×length of 15.75 mm) of a test piece 100 (width of 6.35 mm, length of 15.75 mm, height of 10.16 mm, conforming to the ASTM test method, SUS 440C, HRC 45-50) as the base material was mirror polished so that the arithmetic mean roughness Ra was 0.02 μm or less conforming to JIS-B0601.

Next, each test piece was attached to the jig 120 within the coating apparatus 50 shown in FIG. 3 such that the mirror polished surface faced to the carbon cathodes 56. Then, a vacuum chamber 40 of the coating apparatus 50 was evacuated under vacuum by a vacuum evacuation mechanism to reach the pressure of $5 \times 10^{-3}$ Pa or less.

After the vacuum evacuation, the base material 12 was subjected to ion bombard processing. Thereafter, the intermediate layer 16 consisting of chromium was formed on the surface of the base material 12 (see FIG. 1). Next, the carbon cathodes 56 (99 at % or more of carbon) were evaporated by the arc discharge to form the first hard carbon layer 14 on the surface of the base material 12 without introducing gas from outside. Subsequently, nitrogen gas was introduced without stopping the arc discharge, and the second hard carbon layer 15 including nitrogen was formed by a reactive arc ion plating method.

Examples 2 to 5

In Examples 2 to 5, the first hard carbon layer 14 and the second hard carbon layer 15 were formed similar to Example 1 except that each inert gas shown in Table 2 was introduced when the first hard carbon layer 14 was formed. When the first hard carbon layer was formed in each of Examples 2 to 5, the inert gas pressure was $5 \times 10^{-2}$ Pa or less.

Also in Examples 2 to 5, the first hard carbon layer 14 and the second hard carbon layer 15 were formed similar to Example 1 except that an introduction pressure of nitrogen gas was changed when the second hard carbon layer 15 was formed. The higher the introduction pressure of nitrogen gas is, the more the amount of nitrogen included in the second hard carbon layer increases.

Comparative Example 1

The first hard carbon layer 14 was formed similar to Example 1 except that Ar was introduced at $5 \times 10^{-1}$ Pa when the first hard carbon layer 14 was formed. Note that no second hard carbon layer 15 was formed.

Comparative Example 2

The first hard carbon layer 14 was formed similar to Example 1 except that no second hard carbon layer 15 was formed.

Comparative Examples 3 and 5

The first hard carbon layer 14 and the second hard carbon layer 15 were formed similar to Example 1 except that the introduction pressure of nitrogen gas was higher than that in Example 1 when the second hard carbon layer 15 was formed.

Comparative Examples 4 and 6

The first hard carbon layer 14 and the second hard carbon layer 15 were formed similar to Example 1 except that the introduction pressure of nitrogen gas was lower than that in Example 1 when the second hard carbon layer 15 was formed.

Comparative Example 7

After the first hard carbon layer 14 was formed similar to Example 1, a high frequency bias (frequency of 13.56 MHz) was applied, while acetylene and Ar were introduced, and the hard carbon layer including hydrogen was formed on the first hard carbon layer 14 by the plasma CVD method utilizing high frequency discharge plasma.

It was revealed that the hard carbon layer including hydrogen included 34.3 atom % of hydrogen by the following measurement.

(Evaluation of Grindability and Measurement of Surface Roughness Ra)

Figure 5:
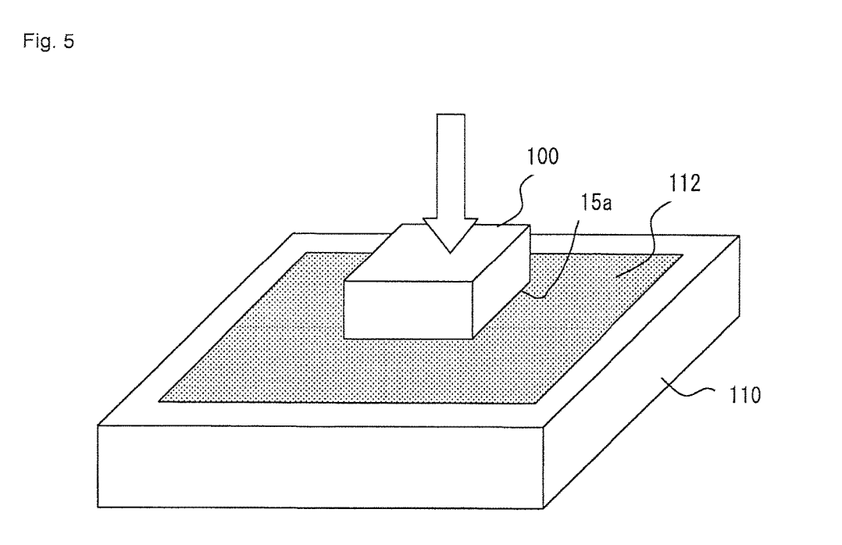
[FIG. 5] A schematic diagram showing a method of polishing and smoothing a film.

Next, in each of Examples and Comparative Examples, the film surface was ground and smoothed, as shown in FIG. 5. In FIG. 5, wrapping paper 112 (film on which diamond having grain size of #1200 was coated as abrasive grain) was disposed on a flat glass surface plate 110, the surface 15a of the second hard carbon layer 15 of the test piece 100 was ground by pushing and moving it reciprocatingly on the wrapping paper 112. The test piece 100 was ground for 10 minutes by applying a load of 3N, a reciprocating stroke of 30 mm, and a frequency of 0.4 seconds.

Next, grounding was performed under the same conditions described above by exchanging the wrapping paper 112 to that having grain size of #2000. After grinding, a stylus type surface roughness tester was used to measure the arithmetic mean roughness Ra conforming to JIS-B0601 on the ground surface 15a at different points for ten times, and an average value was taken as Ra. When Ra is 0.2 μm or less, grindability is considered to good.

In each of Comparative Examples 1 and 2 where no second hard carbon layer 15 was formed, the surface of the first hard carbon layer 14 was ground similar to the above, and Ra was measured.

In Comparative Example 7, the surface of the hard carbon layer including hydrogen formed by the plasma CVD method was ground similar to the above, and Ra was measured.

(Composition of Hard Carbon Layer)

The contents of hydrogen, carbon and nitrogen of the first hard carbon layer 14 and the second hard carbon layer 15 were determined by measurement (RBS/HFS) for the hard carbon film formed on the flat surface as described above.

(Film Thickness of Hard Carbon Layer)

Carbon fine particles discharged from the carbon cathodes along with the arc discharge were taken into the film formed by the vacuum arc method, the surface of the film was not flat and had concave and convex. Then, the thickness of the first hard carbon layer 14 and the thickness of the second hard carbon layer 15 were measured by the following method.

Figure 7:
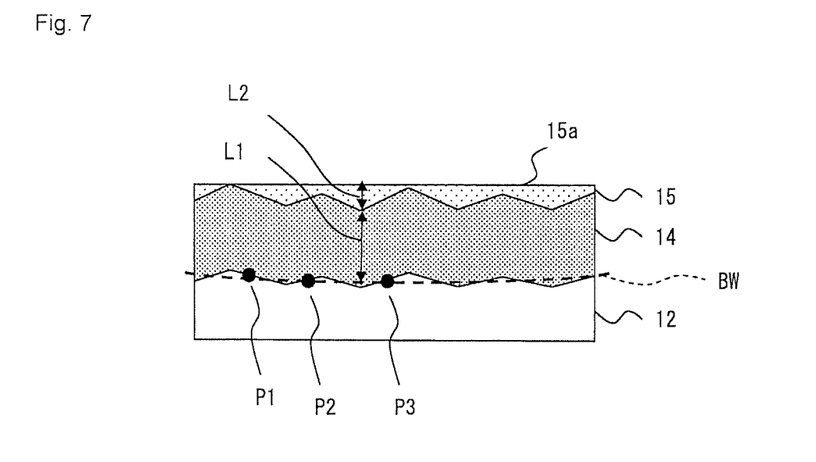
[FIG. 7] A schematic diagram showing a method of measuring thicknesses of the first hard carbon layer and second hard carbon layer.

Firstly, the film of the test piece 100 was ground so that the outermost surface had the arithmetic mean roughness Ra of 0.2 μm or less. Next, a cross section vertical to the ground surface was produced by focused ion beam (FIB) as shown in FIG. 7. On a boundary between the cross section of the base material 12 and the first hard carbon layer 14, coordinates at different ten points, P1, P2, P3 . . . were determined. From the coordinates, a quadratic curve BW representing the boundary was determined by the least-squares method. It should be noted that the intermediate layer 16 interposed between the base material 12 and the first hard carbon layer 14 was regarded as a part of the base material.

A distance L1 from ten points selected randomly on the curve BW to the boundary of the first hard carbon layer 14 and the second hard carbon layer 15 in the vertical direction, and a distance L2 from the boundary to the outermost surface 15a were measured. The L1 and L2 at ten points were averaged to provide the thickness of the first hard carbon layer 14 and a thickness of the second hard carbon layer 15. The boundary between the first hard carbon layer 14 and the second hard carbon layer was determined by measuring a nitrogen distribution using the EDX (energy dispersive X-ray spectrometry) to be positioned at a side nearest to the base material 12 where nitrogen was distributed. If nitrogen distribution showed that nitrogen increased to upward in FIG. 7 and no clear boundary was defined, the site showing the nitrogen content that was ½ of the site having the greatest nitrogen content was regarded as the boundary.

In Comparative Examples 1 and 2 where no second hard carbon layer 15 was formed, an average of the distance from the curve BW to the outermost surface 15a in the vertical direction was defined as the thickness of the first hard carbon layer 14.

(Raman Spectroscopy of Hard Carbon Layer)

Raman spectrum on the surface of the first hard carbon layer 14 and the second hard carbon layer 15 was measured using a laser Raman spectrophotometer (manufactured by JASCO Corporation under a product name of NRS-310, laser light wavelength 532 nm). The surface of each layer was the same as the surface for measuring the composition of the hard carbon layer described above. The Raman spectroscopic spectra were measured at five different points on the surfaces of the first hard carbon layer 14 and the second hard carbon layer 15, and an average value was taken as a peak A described later.

Then, as shown in FIG. 2 and FIG. 4, the resultant Raman spectroscopic spectra were subjected to the peak waveform separation. Specifically, in the peak A in wavenumbers from 900 to 1900 cm$^{-1}$ of the Raman spectroscopic spectra of the first hard carbon layer 14 in FIG. 2, an average value $k_S$ of the wavenumber and an average value of spectral intensity $I_S$ were calculated regarding to plural observed values actually obtained in a wavenumber region from 900 to 910 cm$^{-1}$. Similarly, an average value $k_T$ of the wavenumber and an average value of spectral intensity $I_T$ were calculated regarding to plural observed values actually obtained in a wavenumber region from 1890 to 1900 cm$^{-1}$. Then, a straight line connecting the two points thus determined was defined as a base line B.

Next, the peak A from which the base line B was subtracted was subjected to the peak waveform separation to provide a first Gaussian function Id having a maximum value in the wavenumbers from 1200 cm$^{-1}$ or more to 1400 cm$^{-1}$ or less and a second Gaussian function Ig having a maximum value in the wavenumbers from 1450 cm$^{-1}$ or more to 1650 cm$^{-1}$ or less. The Id and the Ig were determined by regarding the base line B as a zero point, and calculating so that a weighted sum of squared residual from the peak A becomes smallest.

Then, from a ratio between the maximum value Icd of the first Gaussian function Id and the maximum value Icg of the second Gaussian function Ig, Icd/Icg was determined. Also, from a ratio between integrated intensity Ecd of the first Gaussian function Id and integrated intensity Ecg of the second Gaussian function Ig, Ecd/Ecg was determined. Here, the Ecd and the Ecg are integrated values by integrating the Gaussian functions Id, Ig in the wavenumbers from 0 to infinity taking the base line B as a zero point.

(Evaluation of Abrasion Resistance)

Figure 6:
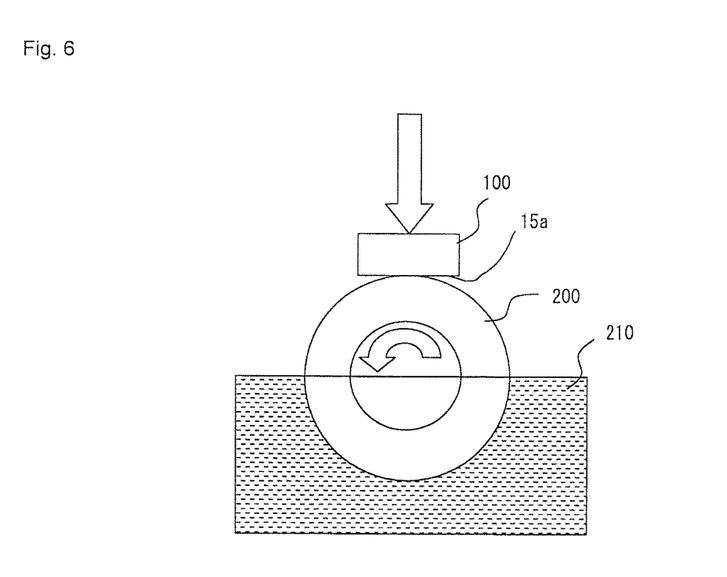
[FIG. 6] A schematic diagram showing a ring-on-block sliding test.

Abrasion resistance of the hard carbon film was evaluated by a ring-on-block sliding test shown in FIG. 6. The evaluation was made by pressing the surface 15a side of the hard carbon film of the test piece 100 to a ring 200 (outside diameter: 34.99 mm, material: SAE4620), and sliding the ring 200 being rotated. The ring 200 was immersed approximately half into lubricant 210 with an axial direction of the ring 200 being horizontal such that once the ring 200 was rotated, the lubricant 210 was fed to a sliding part. Table 1 shows test conditions. Here, the lubricant in Table 1 is commercially available engine oil, and "E special" means that ester is contained.

TABLE 1

| Item | Condition |
| --- | --- |
| Load | 300 N |
| Rotation speed | 0.3 m/sec |
| Ring surface roughness | R$_{zjis}$ 1.70 to 2.20 μm (average 1.95 μm) |
| Lubricant | Commercially available engine oil 5W-30SM (product name: SM Strong Save X · E special) |
| Lubricant temperature | 80° C. |
| Testing time | 2000 sec |

Then, after sliding test was ended, an abrasion depth of the hard carbon film of the test piece 100 was measured using a stylus type surface roughness tester (SURFCOM1400D manufactured b Tokyo Seimitsu, Co., Ltd.). In the sliding test, a stylus was moved to the direction parallel to the sliding direction of the ring 200, and a surface profile was measured as a measurement length that was at least twice of the width of the sliding part. The measurement was performed at different five points in the direction vertical to the sliding direction. At this time, the sliding part was positioned at a center of the measurement length. Based on the surface profile of non-sliding parts at both ends of the sliding part, a straight line representing the surface of the non-sliding parts by the least-squares method. Taking the straight line as a base line, the maximum value of the depth at an abraded part.

Since the ring 200 is circle, its abrasion depth is difficult to be measured. A ten point average roughness $R_{zjis}$ of the surface of the ring 200 was measured to calculate $\Delta R_{zjis}$ that was an increment (change) from $R_{zjis}$ before the test. The ten point average roughness $R_{zjis}$ was measured 10 times or more using the stylus type surface roughness tester by changing a measurement location and a stylus moving direction, and an average value was adopted. The measurement conditions were conforming to JISB0633: 2001.

In each of Comparative Examples 1 and 2 where no second hard carbon layer 15 was formed, the surface of the first hard carbon layer 14 was tested and evaluated similar to the above.

In Comparative Example 7, the surface of the hard carbon layer including hydrogen formed by the plasma CVD method was tested and evaluated similar to the above.

Table 2 shows the obtained results.

TABLE 2

| | Total thickness of film [μm] | First hard carbon layer | | | | | | Second hard carbon layer Composition [atom %] | | |
|---|---|---|---|---|---|---|---|---|---|---|
| | | Inert gas | | Composition [atom %] | | Film thickness | Raman spectroscopic spectrum | | | |
| | | Element | Pressure [Pa] | Hydrogen | Carbon | [μm] | Icd/Icg | Ecd/Ecg | Hydrogen | Carbon | Nitrogen |
| Example 1 | 7.9 | — | — | 1.5 | 96.5 | 6.4 | 1.51 | 2.87 | 1.2 | 90.5 | 7.7 |
| Example 2 | 16.8 | He | $6 \times 10^{-3}$ | 1.8 | 96.3 | 15.7 | 1.73 | 3.77 | 1.7 | 93.1 | 3.3 |
| Example 3 | 5.3 | Ar | $3 \times 10^{-2}$ | 0.8 | 98.9 | 4.0 | 0.97 | 1.72 | 1.3 | 83.4 | 14.3 |
| Example 4 | 10.5 | Ar | $8 \times 10^{-3}$ | 0.2 | 99.6 | 9.2 | 1.14 | 2.31 | 1.7 | 92.3 | 5.1 |
| Example 5 | 3.3 | He | $1 \times 10^{-2}$ | 0.2 | 99.7 | 3.0 | 1.00 | 2.09 | 0.5 | 88.2 | 10.0 |
| Comp-Ex 1 | 5.7 | Ar | $5 \times 10^{-1}$ | 1.4 | 97.6 | 5.7 | 1.90 | 4.00 | — | — | — |
| Comp-Ex 2 | 5.6 | — | — | 0.5 | 98.5 | 5.6 | 0.81 | 1.70 | — | — | — |
| Comp-Ex 3 | 5.3 | — | — | 1.5 | 98.1 | 4.1 | 1.95 | 3.96 | 0.2 | 83.5 | 16.2 |
| Comp-Ex 4 | 5.3 | — | — | 1 | 97.6 | 4.6 | 0.78 | 1.55 | 2.0 | 93.7 | 2.5 |
| Comp-Ex 5 | 5.5 | — | — | 0.7 | 99 | 5.4 | 1.53 | 2.92 | 1.3 | 82.9 | 14.2 |
| Comp-Ex 6 | 5.4 | — | — | 0.8 | 98.6 | 3.9 | 1.49 | 2.90 | 1.3 | 92.3 | 4.1 |
| Comp-Ex 7 | 5.6 | — | — | 1.1 | 98.7 | 5.1 | 1.55 | 3.01 | 34.3 | 65.6 | 0.0 |

| | Second hard carbon layer | | | | Ra of outermost surface (μm) | Film thickness ratio (%) | Abrasion resistance | | Friction coefficient |
|---|---|---|---|---|---|---|---|---|---|
| | Nitrogen (carbon + nitrogen) (%) | Film thickness [μm] | Raman spectroscopic spectrum | | | | Abrasion depth of film [μm] | Change in surface roughness at ring side $\Delta R_{zjis}$ [μm] | |
| | | | Icd/Icg | Ecd/Ecg | | | | | |
| Example 1 | 7.8 | 1.5 | 1.84 | 4.53 | 0.077 | 22.9 | 0.11 | 0.23 | 0.08 |
| Example 2 | 3.4 | 1.1 | 2.22 | 5.82 | 0.129 | 6.8 | 0.09 | 0.31 | 0.08 |
| Example 3 | 14.6 | 1.3 | 1.56 | 5.80 | 0.098 | 32.1 | 0.14 | 0.17 | 0.07 |
| Example 4 | 5.2 | 1.3 | 2.01 | 5.27 | 0.108 | 14.4 | 0.10 | 0.29 | 0.07 |
| Example 5 | 10.2 | 0.3 | 2.38 | 5.67 | 0.092 | 9.7 | 0.09 | 0.22 | 0.08 |
| Comp-Ex 1 | — | — | — | — | 0.101 | 0 | 0.39 | 0.33 | 0.07 |
| Comp-Ex 2 | — | — | — | — | 0.287 | 0 | 0.06 | 1.38 | 0.09 |
| Comp-Ex 3 | 16.2 | 1.2 | 2.69 | 6.21 | 0.069 | 30.2 | 0.59 | 0.20 | 0.08 |
| Comp-Ex 4 | 2.6 | 0.7 | 1.36 | 3.71 | 0.221 | 16.4 | 0.09 | 1.22 | 0.13 |
| Comp-Ex 5 | 14.6 | 0.1 | 1.52 | 6.08 | 0.076 | 2.7 | 0.09 | 1.29 | 0.10 |
| Comp-Ex 6 | 4.3 | 1.5 | 1.53 | 3.85 | 0.239 | 39 | 0.60 | 0.22 | 0.14 |
| Comp-Ex 7 | 0.0 | 0.5 | 1.22 | — | 0.320 | 8.8 | 0.04 | 0.30 | 0.14 |

Also, a frictional force was measured during the sliding test. An average value of the frictional force measured for 20 seconds before the test was ended (1980 to 2000 seconds after the test was started) was divided by the load applied on the test to calculate a numerical value as a friction coefficient. The friction coefficient measured by this method may be regarded as a coefficient of dynamic friction.

When the abrasion depth is 0.3 μm or less, abrasion resistance under an environment where it is in contact with the lubricant is considered to excellent.

When the $\Delta R_{zjis}$ is 1.0 μm or less, the opposite material is less attacked under the environment where it is in contact with the lubricant.

When the friction coefficient is 0.1 or less, frictionality is excellent under the environment where it is in contact with the lubricant.

Table 2 reveals that in each of Examples where the first hard carbon layer included no hydrogen, and the second hard carbon layer included no hydrogen but nitrogen, the outermost surface could be easily ground even when the first hard carbon layer was formed in a thickness of 3 μm or more, the low friction and the abrasion resistance could be realized under the environment where it was in contact with lubricant.

On the other hand, in Comparative Example 1 where inert Ar was introduced at exceeding $1 \times 10^{-2}$ Pa, the abrasion depth exceeded 0.3 μm, the abrasion resistance was poor under the environment where it was in contact with lubricant. This may because carbon ions collide with Ar atoms or ions and lose energy before the hard carbon layer that is the film is formed, thereby softening the film. In addition, in Comparative Example 1, Icd/Icg exceeded 1.8, and Ecd/Ecg exceeded 3.8.

In Comparative Example 2 where no second hard carbon layer was present on the first hard carbon layer, the outermost surface was difficult to be polished, Ra of the surface after polishing exceeded 0.2 μm, and the ring that was the opposite material was heavily attracted and abraded under the environment where it was in contact with lubricant.

In Comparative Example 3 where the percentage of the nitrogen exceeded 15% with respect to the total content of carbon and nitrogen in the second hard carbon layer, the abrasion resistance was poor under the environment where it was in contact with lubricant. In addition, in Comparative Example 3, Icd/Icg exceeded 2.5, and Ecd/Ecg exceeded 6.0 both for the second hard carbon layer.

In Comparative Example 4 where the percentage of the nitrogen was less than 3% with respect to the total content of carbon and nitrogen in the second hard carbon layer, the film became hard, the outermost surface was difficult to be polished, Ra of the surface after polishing exceeded 0.2 μm, and the ring that was the opposite material was heavily attracted and abraded under the environment where it was in contact with lubricant. In addition, in Comparative Example 4, Icd/Icg of the second hard carbon layer was less than 1.5, and Ecd/Ecg of the second hard carbon layer was less than 4.0.

In Comparative Example 5 where the film thickness of the second hard carbon layer was less than 3% of the film thickness of the first hard carbon layer, concave and convex remained on the surface even if the second hard carbon layer was polished, the abrasion resistance was poor under the environment where it was in contact with lubricant.

In Comparative Example 6 where the film thickness of the second hard carbon layer exceeded 30% of the film thickness of the first hard carbon layer, the percentage of the second hard carbon layer having low abrasion resistance was increased, and the abrasion resistance of the surface of the sliding member was poor.

In Comparative Example 7 where the hard carbon layer containing hydrogen in place of the second hard carbon layer was formed, the hard carbon layer contained no nitrogen, thereby increasing a friction coefficient under the environment where it was in contact with lubricant.

DESCRIPTION OF REFERENCE NUMERALS 10 coated sliding member
12 base material
14 first hard carbon layer
15 second hard carbon layer
15a surface of second hard carbon layer

What is claimed is:

1. A coated sliding member for use under an environment where it is in contact with lubricant, comprising:
    a base material; and a hard carbon film formed on a surface of the base material,
    the hard carbon film being constituted of
        a first hard carbon layer having a thickness of 3 μm or more formed on a surface of the base material by a vacuum arc method using carbon and consisting of diamond-like carbon, when a total amount of all elements configuring the first hard carbon layer is defined as 100 atom %, a hydrogen content is 2 atom % or less, and a carbon content is 96 atom % or more, and
        a second hard carbon layer formed on a surface of the first hard carbon layer by a vacuum arc method using carbon and consisting of diamond-like carbon, when a total amount of all elements configuring the second hard carbon layer is defined as 100 atom %, a hydrogen content is 2 atom % or less and a total content of carbon and nitrogen is 96 atom % or more,
    the film thickness of the second hard carbon layer being 3 to 35% of the film thickness of the first hard carbon layer, and the percentage of the nitrogen represented by atom % of the second hard carbon layer is 3 to 15% with respect to a total content of carbon and nitrogen.

2. The coated sliding member according to claim 1, wherein arithmetic mean roughness Ra according to JIS-B0601 of the surface of the second hard carbon layer is 0.2 μm or less.

3. The coated sliding member according to claim 1, wherein, in the Raman spectroscopy of the surface of the first hard carbon layer, when the first hard carbon layer has a peak within a region of wavenumbers 900 to 1900 cm$^{-1}$, and the peak waveform is separated into a first Gaussian function Id having a maximum value within a region of wavenumbers 1200 cm$^{-1}$ to 1400 cm$^{-1}$ and a second Gaussian function Ig having a maximum value within a region of wavenumbers 1450 cm$^{-1}$ to 1650 cm$^{-1}$, a ratio Icd/Icg where the Icd is the maximum value of the first Gaussian function Id, and the Icg is the maximum value of the second Gaussian function Ig is 0.8 to 1.8.

4. The coated sliding member according to claim 1, wherein, in the Raman spectroscopy of the surface of the first hard carbon layer, when the first hard carbon layer has a peak within a region of wavenumbers 900 to 1900 cm$^{-1}$, and the peak waveform is separated into a first Gaussian function Id having a maximum value within a region of wavenumbers 1200 cm$^{-1}$ to 1400 cm$^{-1}$ and a second Gaussian function Ig having a maximum value within a region of wavenumbers 1450 cm$^{-1}$ to 1650 cm$^{-1}$, a ratio Ecd/Ecg where the Ecd is integrated intensity of the first Gaussian function Id, and the Ecg is integrated intensity of the second Gaussian function Ig is 1.7 to 3.8.

5. The coated sliding member according to claim 1, wherein, in the Raman spectroscopy of the surface of the second hard carbon layer, when the second hard carbon layer has a peak within a region of wavenumbers 900 to 1900 cm$^{-1}$, and the peak waveform is separated into a first Gaussian function Id having a maximum value within a region of wavenumbers 1200 cm$^{-1}$ to 1400 cm$^{-1}$ and a second Gaussian function Ig having a maximum value within a region of wavenumbers 1450 cm$^{-1}$ to 1650 cm$^{-1}$, a ratio Icd/Icg where the Icd is the maximum value of the first Gaussian function Id, and the Icg is the maximum value of the second Gaussian function Ig is 1.5 to 2.5.

6. The coated sliding member according to claim 1, wherein, in the Raman spectroscopy of the surface of the second hard carbon layer, when the second hard carbon layer has a peak within a region of wavenumbers 900 to 1900 cm$^{-1}$, and the peak waveform is separated into a first Gaussian function Id having a maximum value within a region of wavenumbers 1200 cm$^{-1}$ to 1400 cm$^{-1}$ and a second Gaussian function Ig having a maximum value within a region of wavenumbers 1450 cm$^{-1}$ to 1650 cm$^{-1}$, a ratio Ecd/Ecg where the Ecd is integrated intensity of the first Gaussian function Id, and the Ecg is integrated intensity of the second Gaussian function Ig is 4.0 to 6.0.

* * * * *